United States Patent [19]
Koyanagi et al.

[11] Patent Number: 5,430,322
[45] Date of Patent: Jul. 4, 1995

[54] THERMOELECTRIC ELEMENT SHEET IN WHICH THERMOELECTRIC SEMICONDUCTORS ARE MOUNTED BETWEEN FILMS

[75] Inventors: Tadamasa Koyanagi, Yasatomachi; Tsunehiro Oohira, Tsukuba, both of Japan

[73] Assignee: Agency of Industrial Science and Technology, Tokyo, Japan

[21] Appl. No.: 347,212

[22] Filed: Nov. 21, 1994

Related U.S. Application Data

[63] Continuation of Ser. No. 116,608, Sep. 7, 1993, abandoned.

[30] Foreign Application Priority Data

Sep. 8, 1992 [JP] Japan .................. 4-265402

[51] Int. Cl.⁶ .............................. H01L 23/56
[52] U.S. Cl. ................. 257/467; 257/930; 257/470; 136/203; 136/211; 136/212; 62/3.2
[58] Field of Search ......... 257/467, 470, 930; 136/203, 211, 212; 62/3.2; 250/352

[56] References Cited

U.S. PATENT DOCUMENTS

| | | | |
|---|---|---|---|
| 3,988,171 | 10/1976 | Miller et al. | 257/747 |
| 5,006,505 | 4/1991 | Skertic | 257/712 |
| 5,103,286 | 4/1992 | Ohta et al. | 257/467 |
| 5,156,004 | 10/1992 | Wu et al. | 257/713 |
| 5,158,339 | 12/1992 | Yokotani et al. | 257/467 |
| 5,228,923 | 7/1993 | Hed | 136/203 |

FOREIGN PATENT DOCUMENTS

| | | | |
|---|---|---|---|
| 63-253677 | 10/1988 | Japan | 257/467 |
| 1-124724 | 5/1989 | Japan | 257/930 |
| 2-35761 | 2/1990 | Japan | 257/467 |
| 3-295281 | 12/1991 | Japan | 257/467 |

*Primary Examiner*—William Mintel
*Assistant Examiner*—Minhloan Tran
*Attorney, Agent, or Firm*—Spencer, Frank & Schneider

[57] ABSTRACT

A thermoelectric element sheet includes at least two layered structures having a plurality of thermoelectric elements which are arranged between insulating films. In each layered structure the thermoelectric semiconductors are arranged in pairs and electrodes connect the thermoelectric semiconductors of each pair to provide a plurality of structural units. Further electrodes connect the structural units. The thermoelectric element sheet can be used in thermoelectric energy conversion systems which depend on the Seebeck, Peltier or Thomson effect to convert thermal energy to electrical energy or vice versa.

23 Claims, 4 Drawing Sheets

THERMOELECTRIC ELEMENT SHEET IN WHICH THERMOELECTRIC SEMICONDUCTORS ARE MOUNTED BETWEEN FILMS

This application is a continuation of application Ser. No. 08/116,608, filed Sep. 7, 1993, now abandoned.

BACKGROUND OF THE INVENTION

1. Field of the Invention

The present invention relates to thermoelectric element sheets comprising thermoelectric elements, which are preferably used in the process of semiconducting thermoelectric conversion, thermoelectric cooling in accordance with the Peltier effect, or the like.

2. Description of the Prior Art

Heretofore, thermoelectric energy conversion systems which depend on the Seebeck, Peltier or Thomson effect for conversion either way between thermal energy and electric energy have been used in the developmental fields of space, oceanography, and the like.

A thermoelectric element is one of the well-known components used in the above systems and is composed of a plurality of structural units, in which each structural unit includes a p-type thermoelectric semiconductor, an n-type thermoelectric semiconductor and an electrode connecting these semiconductors. In this case, each semiconductor has its own predetermined thickness, referred to as the thermal-flow length, which is defined as the distance between the side of the semiconductor facing a warm thermal source (i.e., a gas, liquid, solid or the like which has a relatively high temperature) and the side facing a cold thermal source (i.e., a gas, liquid, solid or the like which has a relatively low temperature).

The thermoelectric elements can be grouped into two different types, i.e., the thermoelectric generating type (e.g., a thermoelectric generator unit) and the Peltier effect type (e.g., a thermoelectric refrigerator unit). The former is responsible for converting heat into electric energy, while the latter is responsible for using electric energy to cool a material down. In spite of the different types, however, they depend on the same physical principle even though each type of thermoelectric elements works at a temperature range different from that of the other.

The conventional thermoelectric element is formed by a fabrication process including the steps of:

(i) forming an ingot of p-type (or n-type) thermoelectric semiconducting ceramic into a p-type (or n-type) thermoelectric semiconductor having a predetermined thermal-flow length by using a well-known forming means such as pressing, sintering or the like;

(ii) connecting an end of the p-type thermoelectric semiconductor and an end of the n-type thermoelectric semiconductor by an electrode to make a structural unit of the thermoelectric element; and (iii) connecting a plurality of the structural units by bridging an electrode between them to make a thermoelectric element, i.e., the p-type thermoelectric semiconductor of one structural unit is connected with the n-type thermoelectric element of the adjacent structural unit.

For the energy generation that is required in the field of space development, the thermoelectric element used in the thermoelectric generator system should be subjected to a temperature difference of 700° C. between the warm thermal source and the cold thermal source. For that reason, the thermoelectric semiconductor should have a thermal-flow length of at least about 30 mm. When the thermoelectric element is fabricated by using such thick thermoelectric semiconductors, large gapped portions are formed between the semiconductors. In this case, a large amount of heat loss can occur in the conventional thermoelectric element as a result of heat radiation or heat convection from the gapped portions. To avoid such heat loss, in general, these gapped portions are filled up with a filler or the like. In spite of taking steps to deal with such disadvantages, however, the filler transmits heat and thus a large amount of heat loss cannot be avoided. Therefore, the conventional thermoelectric element has not been improved so as to decrease the amount of the heat loss from the gapped portion.

In the case of ocean thermoelectric generation using a temperature difference in seawater, the generation system should be applied as a large scaled system in spite of using a low temperature difference (i.e., about 10° C.) between the warm thermal source and the cold thermal source. Therefore, there is no need to use thermoelectric semiconductors having a large thermal-flow length and thus the thermoelectric element can be easily manufactured by using thin thermoelectric semiconductors at a low cost. The width and thickness of thermoelectric semiconductors used in the field of the ocean development are relatively small compared with the semiconductors used in the field of space development, but the thermoelectric elements formed by using such narrow semiconductors also cause heat loss by heat radiation from the gapped portions formed therein.

Furthermore, it would be desirable to improve several of the properties of a conventional thermoelectric element, such as lowering the value of the heat resistance thereof. One of the ways for lowering the heat resistance is to improve the contact between a heat conductive material and the thermoelectric semiconductor. However, the thermoelectric semiconductors used in a conventional thermoelectric element are made of a very fragile ceramic material, and it is difficult to form smooth surfaces on them to make equal contact with the surface of the heat conductive material. Therefore, the heat resistance is increased. For that reason it is also difficult to avoid deformation of the thermoelectric semiconductors, which is due to thermal stress, gravity or the like, when they are employed in the thermoelectric element. Due to the above deformation, furthermore, the above contact becomes still worse. Since the thermal elements are made of a very fragile ceramic material as described above, the thermoelectric semiconductors can be easily broken or split into fragments.

Accordingly, it would be desirable to develop a novel thermoelectric element having a high reliability without causing heat loss due to heat convection, heat conduction or heat radiation in the gapped portions thereof, and it would also be desirable to manufacture the novel thermoelectric element at a low cost.

SUMMARY OF THE INVENTION

It is therefore an object of the present invention, in view of the above problems, to provide a novel thermoelectric element which can be easily manufactured at a low cost and which has a high reliability without heat loss caused by convection, conduction or radiation of the heat from the gapped portions.

In a first aspect of the present invention, a thermoelectric element sheet comprises at least two layered structures having a plurality of thermoelectric elements arranged between insulating films, wherein each thermoelectric element is composed of a plurality of structural units and a plurality of electrodes for connecting between the structural units, and wherein each structural unit has a pair of thermoelectric semiconductors with a predetermined thermal-flow length and an electrode for connecting between the thermoelectric semiconductors.

Here, the films may be metal films which are insulated by means of oxidization. Copper leaf or aluminum leaf may be used.

The films may be plastic thin films.

The electrodes for connecting the thermoelectric semiconductors may be a conductive material selected from silver, gold, solder, aluminum, $SnO_2$ and ITO.

The electrodes for connecting the structural units may be a conductive material selected from silver, gold, solder, aluminum, $SnO_2$ and ITO.

The layered structure may have at least two insulated films:
the first insulated film having a first surface on which the electrodes for connecting the thermoelectric semiconductors are arranged; and
the second insulating film having a second surface on which the electrodes for connecting the structural units and the thermoelectric semiconductors are arranged, the first and second surfaces facing each other in the layered structure.

The electrodes for connecting the thermoelectric semiconductors may be arranged at regular intervals and form a plurality of parallel lines in a predetermined direction, in which the electrodes in adjacent lines are diagonally opposite each other.

The electrodes for connecting the thermoelectric semiconductors may be arranged in the direction of a line so as to satisfy the inequality $$A<C<B$$

where "A" is the distance between the thermoelectric semiconductors that are paired in a structural unit;
"B" is the distance between the adjacent structural units; and
"C" is the length of the electrode for connecting the thermoelectric semiconductors.

The structural unit may have a gapped portion between the thermoelectric semiconductors and the gapped portion may be filled with a heat-insulating material.

The heat-insulating material may be selected from niobium clad copper, astroquarz yarn and microquarz insulation.

In a second aspect of the present invention, a thermoelectric refrigeration system using a thermoelectric element sheet comprises at least two layered structures having a plurality of thermoelectric elements arranged between insulating films, wherein each thermoelectric element is composed of: a plurality of structural units having a pair of thermoelectric semiconductors with a predetermined thermal-flow length and an electrode for connecting between the thermoelectric semiconductors; and a plurality of electrodes for connecting between the structural units.

In a third aspect of the present invention, a thermoelectric generation system using a thermoelectric element sheet comprises at least two layered structures having a plurality of thermoelectric elements arranged between insulating films, wherein each thermoelectric element is composed of: a plurality of structural units having a pair of thermoelectric semiconductors with a predetermined thermal-flow length and an electrode for connecting between the thermoelectric semiconductors; and a plurality of electrodes for connecting between the structural units.

The above and other objects, effects, features and advantages of the present invention will become more apparent from the following description of embodiments thereof taken in conjunction with the accompanying drawings.

DETAILED DESCRIPTION OF THE PREFERRED EMBODIMENT

A thermoelectric element sheet in accordance with the present invention has a layered structure in which a plurality of structural units of thermoelectric elements are arranged between insulated films. Each structural unit is connected with the adjacent one by means of an electrode and is composed of a pair of thermoelectric semiconductors (i.e., p- and n-types) and an electrode for connecting these semiconductors. Each thermoelectric semiconductor has a predetermined thermal-flow length.

In accordance with the temperature range at which the thermoelectric element sheet is operated, the material of the insulated film is selected from insulated metals, such as copper leaf, aluminum leaf, or the like, having oxidized surfaces, or it is selected from non-metals, such as a plastic thin film or the like. For the electrode material, on the other hand, a conductive material such as silver, gold, solder, aluminum, $SnO_2$, ITO or the like is used.

The thermoelectric element sheet can be manufactured by one of the well-known processes, for example a process comprising the steps of:
(i) forming a plurality of electrodes which are to be used for connecting the structural units on the surface of a film by means of masking followed by spray etching, or by means of printing such as screen printing or bubble jet printing, or other forming means;

(ii) stabilizing the surface of the film by drying at a low temperature or subjecting it to a sintering process;

(iii) forming a plurality of structural units on the above electrodes by the same means employed in step (i), in which each unit is formed so as to be composed of a pair of thermoelectric semiconductors (p-type and n-type) having predetermined thermal-flow lengths;

(iv) filling gapped portions formed in the structural units with a heat-insulating material such as niobium clad copper, astroquarz yarn or microquarz insulation, having a low heat conductivity;

(v) forming further electrodes for connecting p- and n-type semiconductors in each structural unit by the same means employed in step (i) to make a layer;

(vi) laying the layers one on top of another to make a plural stage structure; and (vii) laying an insulated film on a top of the plural stage structure to obtain a thermoelectric element sheet.

Another example of the process for manufacturing the thermoelectric element sheet in accordance with the present invention comprises the step of:

(i) forming the electrodes which are to be used for connecting the structural units and forming thermoelectric semiconductors on a first side of a first film by the same means as described above, and also forming the electrodes which are to be used for connecting the thermoelectric semiconductors in each structural unit on a second side of a second film by the same means as described above;

(ii) placing the first side of the first film on the second side of the second film to make a layer; and (iii) laying a plurality of the layers one on top of another to make a thermoelectric element sheet having a plural stage structure.

As the total number of the steps in the latter process is smaller than that of the former one, the thermoelectric element sheet can be easily manufactured by the latter process. In addition, the latter process does not have a step of filling gapped portions between the thermoelectric semiconductors with a heat insulating material, so that the gapped portions may be filled with gas or kept in a vacuum to prevent heat loss caused by heat conduction. In spite of such advantage in the latter process, however, it is difficult to make appropriate contact between the thermoelectric semiconductors on the first side of the first film and the electrodes on the second side of the second film. To avoid this disadvantage, the electrodes are arranged so as to form a staggered or irregular pattern on the film. For example they can be arranged so as to form lines with certain intervals in the direction of the X axis (or the Y axis) while such lines of electrodes are arranged so as to deviate from an assumed standard line in the direction of the Y axis (or the X axis). According to such arrangement, it is possible to contact at least one electrode with the upper ends of a pair of the thermoelectric semiconductors. According to such arrangement, furthermore, some of the radiated heat from the gapped portions of the structural units is reflected by the surface of the electrodes. Consequently, the heat loss caused by heat radiation can be decreased.

<EXAMPLE 1>

Figure 1:
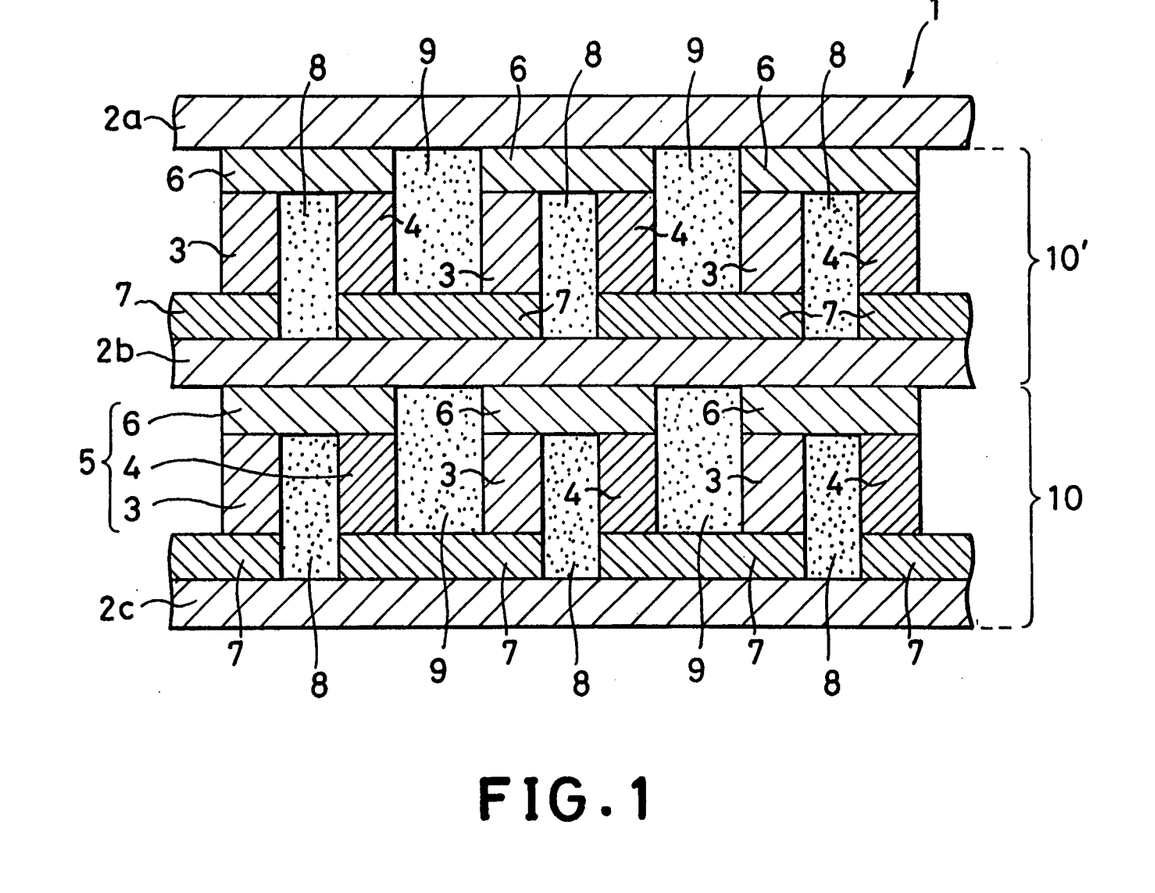
FIG. 1 is a cross sectional view of an example of the thermoelelectric element sheet in accordance with the present invention taken along a plane parallel to a vertical line.

FIG. 1 illustrates one of the preferred embodiments of the thermoelectric element sheet in accordance with the present invention. The thermoelectric element sheet 1 is a two stage structure having three films 2a, 2b and 2c in which a plurality of thermoelectric semiconductors 3, 4 are arranged. A structural unit 5 of the thermoelectric element sheet 1 is composed of a p-type thermoelectric semiconductor 3, an n-type thermoelectric semiconductor 4 and an electrode 6 connecting a pair of the semiconductors 3 and 4. A plurality of the structural units are arranged between the films 2a, 2b, 2c and they are electrically connected with each other. That is, as shown in the figure, one unit is connected with an adjacent unit by an electrode 7 to form a thermoelectric element. In this example, gapped portions 8, 9 between the thermoelectric semiconductors are filled with a heat insulating material.

The thermoelectric element sheet 1 was manufactured as follows.

First, a plurality of the electrodes 7 were formed at regular intervals on a surface of the film 2c by means of spray printing using masking, and then they were sintered to stabilize the surface. In the same way, thermoelectric semiconductors (p-type and n-type) 3 and 4 having a predetermined thermal-flow length were formed on both ends of each electrode 7, respectively, and then gapped portions 8, 9 were filled with the heat insulating material having a low heat conductivity. Pairs of the thermoelectric semiconductors 3 and 4 were connected with electrodes 6 so as to make a bridge between their upper ends by using the same technique as described above. Consequently, a layer 10 of the thermoelectric element sheet 1 was formed. Furthermore, another layer 10' was placed on the layer 10 to form a two stage structure and then further film 2a was placed on top of the two stage structure to make a sheet. In this step, the electrodes 6 could be connected to an external supply if required. Lastly, the sheet was stabilized by drying and sintering to obtain the thermoelectric element sheet 1 of the present invention.

In this example, the thermoelectric element sheet has a two stage structure as shown in the FIG. 1. However the invention is not limited to such a two stage structure and further layers can be added in accordance with its application in the field of ocean development, space development or the like. For example, the number of the layers can be determined in accordance with: the shapes of the heat-conductive portions of the system (flat concave of convex); the thermal condition of the surroundings; or the like.

<EXAMPLE 2>

Figure 2:
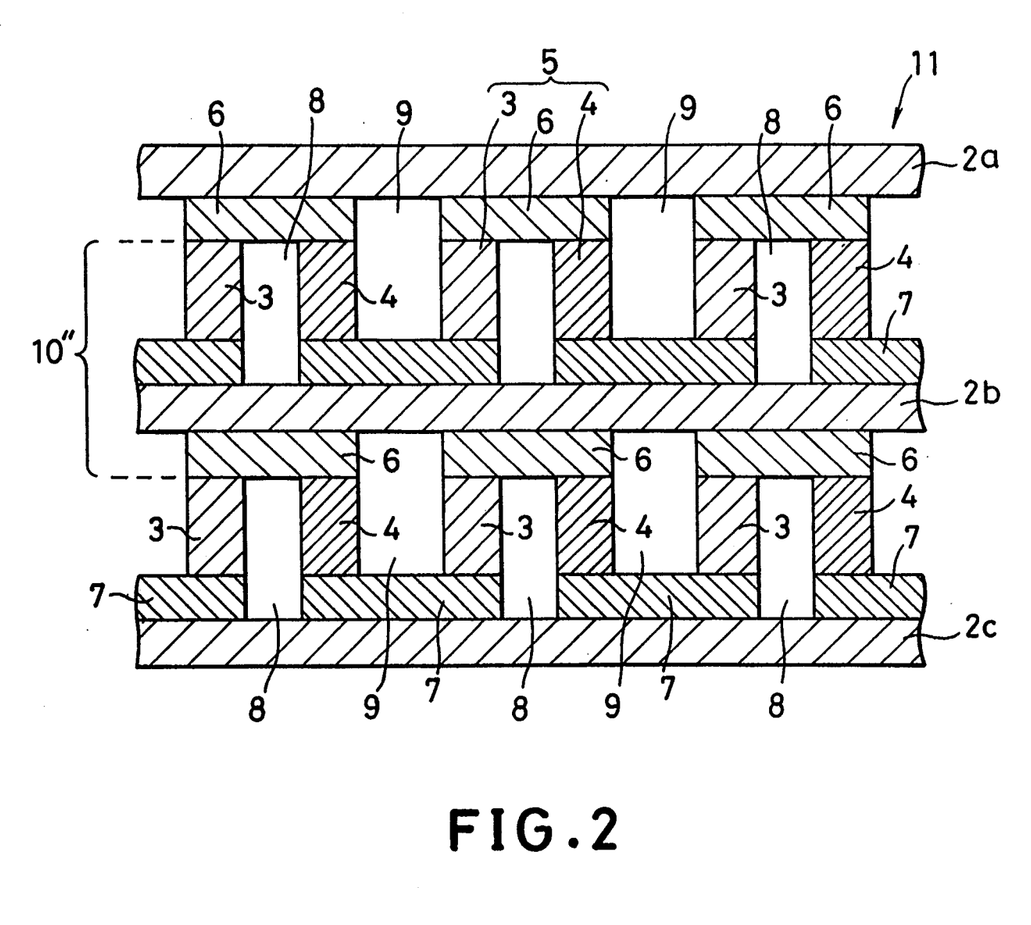
FIG. 2 is a cross sectional view of another example of the thermoelectric element sheet in accordance with the present invention taken along a plane parallel to a vertical line.

FIG. 2 illustrates another preferred embodiment of the thermoelectric element sheet in accordance with the present invention, which has the same construction as that of example 1 except that the gapped portions 8, 9 are not filled with heat-insulating material. The thermoelectric element sheet 11 of this example was manufactured by the same process as Example 1 except that: the thermoelectric semiconductors 3 and 4 and the electrodes 7 were formed on the top side of the film 2c, while the electrodes 6 were formed on the bottom side of the film 2b; and then the bottom side of the film 2b was placed on semiconductors formed on the top side of film 2c to provide a layer.

In the case of manufacturing the thermoelectric element sheet of example 1, each electrode 6 is laid on the top of a pair of the thermoelectric semiconductors 3, 4 on the top side of a film before two films are laid one on top of another. Therefore there is no need to take into account the relative position of the electrodes 6 with respect to the thermoelectric semiconductors 3, 4 when the top side of one film is placed on the bottom side of another. In contrast with example 1, when a thermoelectric element sheet of example 2 is made there is a strong possibility that the electrodes 6 on the bottom side of film 2b may not be aligned with the tops of the thermoelectric semiconductors 3, 4 formed on the top side of the film 2c when the two films 2b, 2c are put together to form a thermoelectric element sheet on a flat, convex or concave surface of the heat conductive portion of the system.

Figure 3:
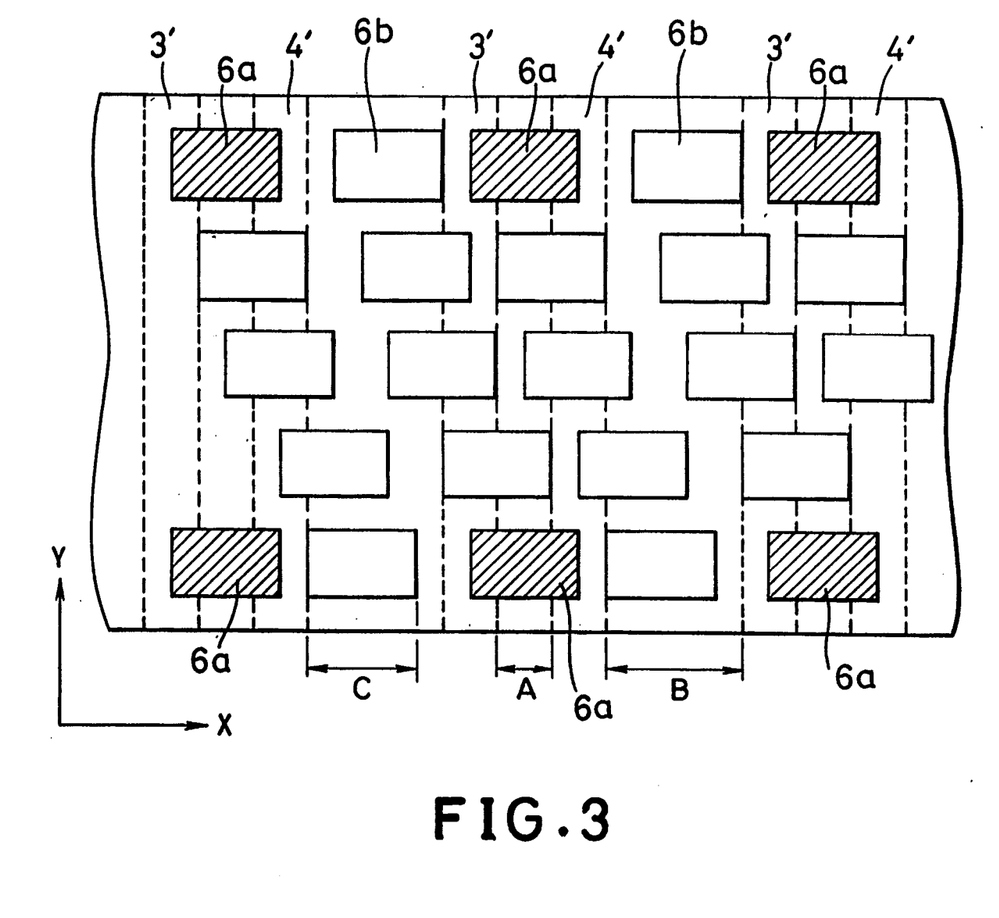
FIG. 3 is a plane view of the thermoelectric element sheet in accordance with the present invention and is presented to help explain the details of the arrangement of the p-type thermoelectric semiconductors and n-type thermoelectric semiconductors on a film.

To avoid such misalignment and to place the electrodes 6 on both the p- and n-type thermoelectric semiconductors 3, 4, the electrodes 6 may be arranged on the bottom side of the film 2b as illustrated in FIG.3.

<EXAMPLE 3>

FIG. 3 illustrates the bottom side of the film used in the third preferred embodiment of the thermoelectric element sheet in accordance with the present invention, which has the same construction as example 2 except that the electrodes 6 (6a, 6b) are arranged as follows. In this figure, the positions corresponding to the n- and p-type thermoelectric semiconductors 3, 4 on the top side of film 2c are represented by reference numerals 3' and 4', respectively. A plurality of the electrodes 6a, 6b are arranged at irregular intervals and lined up to form a plurality of parallel lines in the direction of the X axis. In each line, the electrodes 6 provided a sequence of potential connections between the thermoelectric semiconductors 3, 4 when the bottom side of the film 2b is placed on the top side of the film 2c. In the direction of the Y axis, on the other hand, the electrodes 6 do not form parallel lines and instead are set diagonally opposite to each other to form an irregular arrangement. These axes are fixed in the two-dimensional plane in the figure, in which the X axis is perpendicular to the Y axis.

It is noted that these electrodes 6a, 6b are arranged so as to satisfy the following inequality:

$$A < C < B \quad (1)$$

wherein
"A" is the distance between the p-type thermoelectric semiconductor 3 and the n-type thermoelectric semiconductor 4 in a structural unit 5;
"B" is the distance between adjacent structural units 5, i.e., the distance between the n-type thermoelectric semiconductor 3 of one structural unit and the p-type thermoelectric semiconductor 4 of the adjacent structural unit, these semiconductors being connected by an electrode 7; and
"C" is a length of the electrodes 6.

When the electrodes 6 are arranged on the film 2b as described above and satisfy the above inequality (1), at least one of the electrodes 6 bridges the gap between the p-type thermoelectric semiconductor 3 and the n-type thermoelectric semiconductor 4 in the structural unit. In the figure, for example, the electrodes 6a contribute to the connection of the thermoelectric semiconductors but the electrodes 6b do not contribute such connections.

As compared with example 2, therefore, the bottom side of the film 2b can be easily placed on the top side of the film 2c because there is no need to bring each electrode to its own position, precisely. According to the present example, at least one of the electrodes 6 is positioned at the right location for connecting a pair of thermoelectric semiconductors 3, 4 even if the film 2b is carelessly placed on the film 2c.

Consequently the above described arrangement of the electrodes 6 on the bottom side of the film 2b can be preferably used when the thermoelectric element sheet covers a convex or concave surface of a material or a cylindrically formed material. The electrodes on the film are displaced little by little in proportion to the thickness of the layered films and the curved surface of the material.

If the film that is used is not a metal type, the radiated heat should be reflected by the electrodes. In the thermoelectric element sheet in accordance with example 3, the radiated heat can be effectively reflected by each electrode 6 because of the irregular arrangement of the electrodes in one direction.

If the thermoelectric element sheet of example 3 is applied on a convex or concave surface of a material, for example a cylindrical heat-conductive portion of the system, a unit 10" formed on either side of a film can be bent in either direction. When thick thermoelectric semiconductors 3, 4 are used and their thickness is enough to obstruct the bending of the layer unit 10" in one direction (for example, parallel to the Y axis), the unit 10" may be bent in the other direction (for example, parallel to the X axis) to cover the above surface.

<EXAMPLE 4>

Figure 4:
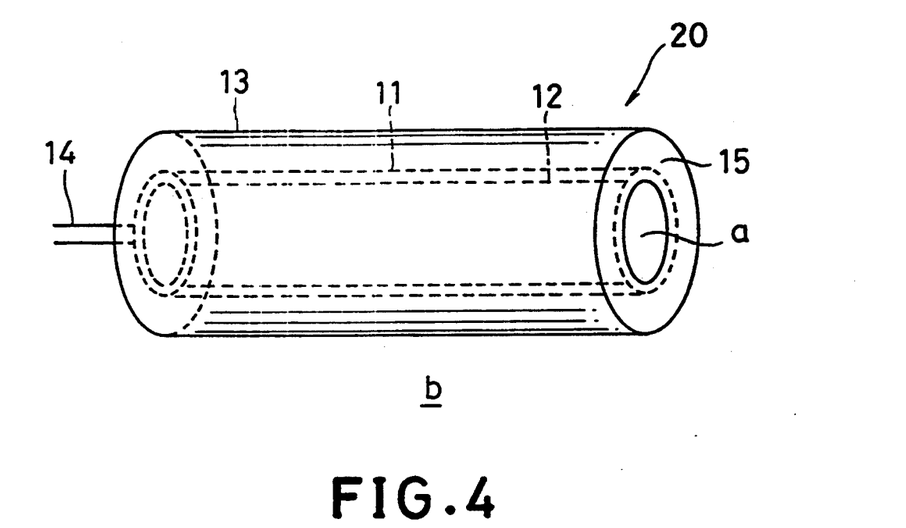
FIG. 4 is a schematic drawing to illustrate a part of a thermoelectric generating system which has a cold medium in its center portion and which depends on a temperature difference in seawater, in which the thermoelectric element sheet in accordance with the present invention is used.

FIG. 4 illustrates the fourth preferred embodiment of the thermoelectric element sheet of the present invention. In this figure, the thermoelectric element sheet is used in an ocean electric generation system in which a temperature difference in seawater is exploited as a source of energy.

The ocean electric generation system 20 comprises a pipe 12 through which cold water a flows; a pipe 13 surrounded by warm water b; and insulated output wires 14. The outer surface of the pipe 12 is directly surrounded by the thermoelectric element sheet 11 of the present invention. Furthermore, an electrically heat insulating but conductive medium 15 is sealed tight in a space between the thermoelectric element sheet 11 and the inner surface of the pipe 13. It is noted that the medium 15 does not change the qualities of the thermoelectric element sheet. A quantity of seawater from a deep portion of the sea is provided as the cold water a (a cold thermal source) and is passed through the pipe 12, while seawater obtained from the surface portion of the sea is provided as the warm water b (a warm thermal source) surrounding the pipe 13. The temperature difference between the sources is about 10° C.

It is noted that the conventional electric generation system using the temperature difference of sea water comprises heat conduction tubes through which warm and cold water flow. These tubes have portions which are exposed to seawater and thus heat is lost through these portions. According to the present example, on the other hand, there is the heat conductive medium between the pipe 12 and the warm water. Therefore, the heat loss can be avoided.

It is also noted that the conventional heat conduction tube has a warped surface as a result of its manufacturing process, so that the conventional thermoelectric element cannot make good contact with the heat conduction tube. In the present example, on the other hand, the thermoelectric element sheet 11 is formed as a flexible sheet and makes good contact with a surface of the cold pipe 12.

In this example, the heat pipe 13 may be optionally provided in a large water tank or covered by a protecting net to avoid damage.

<EXAMPLE 5>

Figure 5:
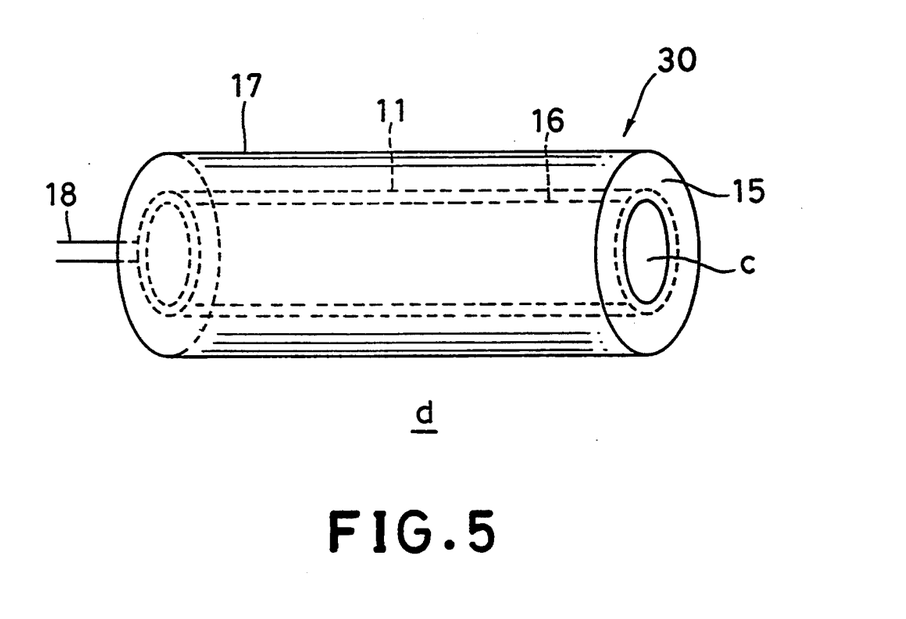
FIG. 5 is a schematic drawing to illustrate part of a thermoelectric cooling system which has a heat medium in its center portion and which depends on the Peltier effect, in which the thermoelectric element sheet in accordance with the present invention is used.

FIG. 5 illustrates the fifth preferred embodiment of the thermoelectric element sheet of the present invention.

The thermoelectric element sheet in accordance with the present example is used in a thermoelectric refrigerator system in accordance with the Peltier effect.

In this figure, the thermoelectric refrigerator system 30 comprises a pipe 16 through which a warm thermal medium c flows, a pipe 17 surrounded by a cool thermal medium d, and insulated input wires 18. The outer surface of the pipe 16 is directly surrounded by the thermoelectric element sheet 11 of the present invention. Furthermore, an electrically insulating but heat conductive medium 15 is sealed tight in a space between the thermoelectric element sheet 11 and the inner surface of the pipe 17. It is noted that the medium 15 does not change the qualities of the thermoelectric element sheet. A quantity of the warm thermal medium c is passed through the pipe 16, while air is circulated around pipe 17 as the cold thermal medium d. The temperature difference between the thermal media is about 30° C.

If there is no mechanical contact in the system, the heat medium 15 and the pipe 16 may be omitted and the thermoelectric element sheet 11 can be exposed directly to the cold thermal source.

The advantageous features of the present invention will be summarized below. Additional advantages not listed will be apparent to those skilled in the art of thermoelectric transducers or other related products.

(i) The amount of heat loss can be reduced because both sides of the gapped portions of the thermoelectric element are sealed by insulated films and its length is practicably under 1 mm, so that only negligible heat loss is caused by the heat convection.

In accordance with the present invention, therefore, convection, conduction or radiation of the heat from the gapped portions of the thermoelectric elements can be prevented by the above layered structure.

(ii) As described above, when the gapped portions are kept at a vacuum or filled up with gas instead of with insulating material, only negligible heat conduction is observed through the gap.

(iii) If the films are made of a metal such as aluminum, copper or the like, the surfaces of the films reflect radiated heat and thus almost all heat loss caused by radiation can be prevented. For example, above 95% of infrared radiation at a wavelength of 1.5 μm or over can be reflected by a metal film. It is noted that it can be also reflected by a thin deposited film of such metal. In accordance with the present invention, furthermore, the films or the electrodes have a thickness of 1 μm or over and thus are able to reflect the radiated heat perfectly.

(iv) If the films are not made of a metal, the radiated heat passing through the films can be reflected by the electrodes on the films. For reflecting the radiated heat efficiently, it is preferable that the electrodes on one film are not precisely above the electrodes on the other films, respectively. According to one of the preferred embodiments of the present invention, these electrodes can be piled out of the vertical to the films because of their irregular arrangements on the films. Therefore the radiated heat can be reflected by the surfaces of the films and the electrodes. In this case, the reflected heat is absorbed in the thermoelectric semiconductors. Consequently, the thermoelectric element sheet in accordance with present invention never wastes the heat.

(v) If the thermoelectric element sheet is wrapped around an object, the electrodes on the films are naturally offset in a vertical direction to the films. Therefore there no need to offset each electrode consciously.

(vi) The thermoelectric element sheet in accordance with the present invention has flexible films which contact heat conductive portion of the system well, so that a low heat resistance at the contact portion can be attained.

If a heat source at a high or low temperature has a flat or curved surface, the films may be stacked on the surface.

If a medium at a high or low temperature is passed through a pipe, the thermoelectric element sheet can be wrapped around the outer surface of the pipe. The heat resistance between the medium and the thermoelectric semiconductors in the sheet can be minimized by placing the sheet directly on the outer surface of the pipe.

Furthermore, the thermoelectric element sheet comprises a large number of thermoelectric semiconductors. In spite of the fact that these thermoelectric semiconductors are made of a very fragile ceramic material, they are sandwiched by the sheet materials so as to be reinforced.

When the thermoelectric element sheet is subjected to stress generated by physical factors such as heat, gravitation and the like, most of the stress can be abated and relaxed by the elastic films.

Therefore, the thermoelectric semiconductors are not deformed or destroyed by the stress and thus the reliability of the thermoelectric semiconductors can be increased.

The present invention has been described in detail with respect to preferred embodiments, and it will now be apparent that changes and modifications may be made without departing from the invention in its broader aspects, and it is the intention, therefore, in the appended claims to cover all such changes and modifications as fall within the true spirit of the invention.

What is claimed is:

1. A thermoelectric element sheet, comprising:
   at least two layered structures having a plurality of thermoelectric elements which are arranged between surface-insulated metal films,
   wherein each thermoelectric element includes a plurality of structural units and a plurality of electrodes connecting said structural units,
   wherein each structural unit has a pair of thermoelectric semiconductors with a predetermined thermal-flow length and an electrode connecting said thermoelectric semiconductors, and wherein each of said surface-insulated metal films consists of a metal layer covered with an insulation layer.

2. A thermoelectric element sheet as claimed in claim 1, wherein each of said surface-insulated films is selected from the group consisting of a copper leaf with surface oxidation and an aluminum leaf with surface oxidization.

3. A thermoelectric element sheet as claimed in claim 1, wherein, in each structural unit, said electrode connecting said thermoelectric semiconductors is made from a conductive material selected from the group consisting of silver, gold, solder, aluminum, $SnO_2$ and ITO.

4. A thermoelectric element sheet as claimed in claim 1, wherein said electrodes connecting said structural units are made from a conductive material selected from the group consisting of silver, gold, solder, aluminum, $SnO_2$ and ITO.

5. A thermoelectric element sheet as claimed in claim 1, wherein said surface-insulated metal films include at least:

a first film having a first insulated surface on which are arranged said electrodes connecting said thermoelectric semiconductors of the structural units of a respective one of said thermoelectric elements; and a second film having a second insulated surface on which are arranged said electrodes connecting said structural units of said respective one of said thermoelectric elements, said first and second insulated surfaces facing each other.

6. A thermoelectric element sheet as claimed in claim 5, further comprising additional electrodes that are arranged on said first insulated surface, and wherein the electrodes arranged on said first insulated surface are disposed at intervals and form a plurality of parallel lines in a predetermined direction, with electrodes in adjacent lines being offset from each other.

7. A thermoelectric element sheet as claimed in claim 1, wherein said structural units have gapped portions between said thermoelectric semiconductors, and further comprising heat-insulating material in said gapped portions.

8. A thermoelectric element sheet as claimed in claim 9, wherein said heat-insulating material is selected from the group consisting of niobium clad copper, astroquarz yarn and microquarz insulation.

9. A thermoelectric element sheet as claimed in claim 1, wherein each of said surface-insulated metal films is prepared by oxidizing a surface of a metal by means of anode oxidation.

10. A thermoelectric refrigeration system, comprising:

a thermoelectric element sheet which includes at least two layered structures having a plurality of thermoelectric elements which are arranged between surface-insulated metal films, wherein each thermoelectric element includes a plurality of structural units having a pair of thermoelectric semiconductors with a predetermined thermal-flow length and an electrode connecting said thermoelectric semiconductors, wherein each thermoelectric element further includes a plurality of electrodes connecting said structural units, and wherein each of said surface-insulated metal films consists of a metal layer covered with an insulation layer.

11. A thermoelectric generation system, comprising a thermoelectric element sheet which includes at least two layered structures having a plurality of thermoelectric elements which are arranged between surface-insulated metal films, wherein each thermoelectric element includes a plurality of structural units having a pair of thermoelectric semiconductors with a predetermined thermal-flow length and an electrode connecting said thermoelectric semiconductors, wherein each thermoelectric unit further includes a plurality of electrodes connecting said structural units, and wherein each of said surface-insulated metal films consists of a metal layer covered with an insulation layer.

12. A thermoelectric element sheet, comprising:

at least two layered structures having a plurality of thermoelectric elements which are arranged between surface-insulated metal films, wherein each thermoelectric element includes a plurality of structural units and a plurality of electrodes connecting said structural units, wherein each structural unit has a pair of thermoelectric semiconductors with a predetermined thermal-flow length and an electrode connecting said thermoelectric semiconductors, wherein said electrodes connecting said thermoelectric semiconductors of said structural units are arranged so as to keep their contacts with said thermoelectric semiconductors when said thermoelectric element sheet is bent, and consists of a metal layer covered with an insulation layer.

13. A thermoelectric sheet as claimed in claim 12, wherein the electrodes connecting the thermoelectric semiconductors of the structural units of one of the thermoelectric elements are arranged on one of the insulating films along with a plurality of additional electrodes, the electrodes arranged on said one of the insulating films being disposed at intervals and forming a plurality of parallel lines which extend in a predetermined direction, with electrodes in adjacent lines being offset from each other.

14. A thermoelectric element sheet as claimed in claim 12, wherein each of said surface-insulated metal films has a thickness of about 1 $\mu$m or greater.

15. A thermoelectric element sheet, comprising:

a plurality of pairs of thermoelectric semiconductors;

a surface-insulated metal film, said surface-insulated metal film consisting of a metal layer covered with an insulation layer;

electrode means on the film for electrically connecting the thermoelectric semiconductors of each pair to one another;

a further surface-insulated metal film, said further surface-insulated metal film consisting of a metal thermoelectric semiconductors being disposed between the film and the further film; and further electrode means on the further film for electrically connecting thermoelectric semiconductors in adjacent pairs to one another, the further electrode means including first electrodes that are disposed in a first line at predetermined intervals, and second electrodes that are disposed in a second line at the same predetermined intervals, the second line being parallel to the first line, the second electrodes being offset from the first electrodes so that the first and second electrodes do not lie in columns which are perpendicular to the first and second lines.

16. The thermoelectric element sheet of claim 15, wherein the films are flexible.

17. The thermoelectric element sheet of claim 15, further comprising:
a plurality of pairs of additional thermoelectric semiconductors;
an additional surface-insulated metal film, said additional surface-insulated metal film consisting of a metal layer covered with an insulation layer, the additional thermoelectric semiconductors being disposed between the further film and the additional film;
additional electrode means, on one of the further film and the additional film, for electrically connecting the additional thermoelectric semiconductors of each pair to one another; and
further additional electrode means, on the other of the further film and the additional film, for connecting additional thermoelectric semiconductors in adjacent pairs, the further additional electrode means including
additional first electrodes that are disposed in an additional first line at predetermined intervals, and
additional second electrodes that are disposed in an additional second line at the same predetermined intervals, the additional second line being parallel to the additional first line, the additional second elements being offset from the additional first elements so that the additional first elements and the additional second elements do not lie in columns which are perpendicular to the additional first line and the additional second line.

18. The thermoelectric element sheet of claim 15, in combination with a tubular member around which the thermoelectric element sheet is wrapped.

19. A thermoelectric element sheet, comprising:
at least two layered structures having a plurality of thermoelectric elements which are arranged between surface-insulated metal films,
wherein each thermoelectric element includes a plurality of structural units and a plurality of electrodes connecting said structural units,
wherein each structural unit has a pair of thermoelectric semiconductors with a predetermined thermal-flow length and an electrode connecting said thermoelectric semiconductors, and
wherein said surface-insulated metal films include at least
a first film having a first insulated surface on which are arranged said electrodes connecting said thermoelectric semiconductors of the structural units of a respective one of said thermoelectric elements; and
a second film having a second insulated surface on which are arranged said electrodes connecting said structural units of said respective one of said thermoelectric elements, said first and second insulated surfaces facing each other; and
additional electrodes that are arranged on said first insulating surface, the electrodes arranged on said first insulating surface being disposed at intervals to form a plurality of parallel lines in a predetermined direction, with electrodes in adjacent lines being offset from each other, the electrodes in each line on said first insulating surface being arranged in the direction of the respective line so as to satisfy the inequality $$A<C<B$$

where "A" is the distance between the pair of thermoelectric semiconductors in each structural unit,
"B" is the distance between adjacent structural units, and
"C" is the length of the electrodes arranged on said first insulating surface.

20. A thermoelectric element sheet, comprising:
at least two layered structures having a plurality of thermoelectric elements which are arranged between insulating films,
wherein each thermoelectric element includes a plurality of structural units and a plurality of electrodes connecting said structural units,
wherein each structural unit has a pair of thermoelectric semiconductors with a predetermined thermal-flow length and an electrode connecting said thermoelectric semiconductors,
wherein said electrodes connecting said thermoelectric semiconductors of said structural units are arranged so as to keep their contacts with said thermoelectric semiconductors when said thermoelectric element sheet is bent, the electrodes connecting the thermoelectric semiconductors of the structural units of one of the thermoelectric elements being arranged on one of the insulating films along with a plurality of additional electrodes, the electrodes arranged on said one of the insulating films being disposed at intervals and forming a plurality of parallel lines which extend in a predetermined direction, with electrodes in adjacent lines being offset from each other, the electrodes in each line on said one of the insulating films being arranged in the direction of the respective line so as to satisfy the inequality $$A<C<B$$

where "A" is the distance between the pair of thermoelectric semiconductors in each structural unit,
"B" is the distance between adjacent structural units, and
"C" is the length of the electrodes arranged on said one of the insulating films.

21. A thermoelectric element sheet, comprising:
a plurality of pairs of thermoelectric semiconductors;
a film;
electrode means on the film for electrically connecting the thermoelectric semiconductors of each pair to one another;
a further film, the pairs of thermoelectric semiconductors being disposed between the film and the further film; and
further electrode means on the further film for electrically connecting thermoelectric semiconductors in adjacent pairs to one another, the further electrode means including first electrodes that are disposed in a first line at predetermined intervals, second electrodes that are disposed in a second line at the same predetermined intervals, the second line being parallel to the first line, the second electrodes being offset from the first electrodes so that the first and second electrodes do not lie in columns which are perpendicular to the first and second lines, and third electrodes that are disposed in a third line at the same predetermined intervals, the third line being parallel to the first and second lines, the third electrodes being offset from the second electrodes so that the second and third electrodes do not lie in columns which are perpendicular to the second and third lines, the third electrodes additionally being offset from the first electrodes so that the first and third electrodes do not lie in columns which are perpendicular to the first and third lines.

22. The thermoelectric element sheet of claim 21, wherein the distance between the first and second lines is the same as the distance between the second and third lines, and wherein the first, second, and third electrodes lie in parallel columns which slant with respect to the first, second and third lines.

23. The thermoelectric element sheet of claim 21, wherein the predetermined intervals are such that $A<C<B$, where A is the distance between the thermoelectric semiconductors in each pair, B is the distance between adjacent pairs of thermoelectric semiconductors, and C is the length of the electrodes.

* * * * *